United States Patent [19]

Mote, Jr.

[11] Patent Number: 5,339,345
[45] Date of Patent: Aug. 16, 1994

[54] FREQUENCY DIVIDER CIRCUIT

[75] Inventor: Lewis R. Mote, Jr., Laguna Hills, Calif.

[73] Assignee: AST Research Inc., Irvine, Calif.

[21] Appl. No.: 938,279

[22] Filed: Aug. 31, 1992

[51] Int. Cl.$^5$ .................... H03K 21/10; H03K 23/48
[52] U.S. Cl. ........................ 377/48; 377/56; 377/114
[58] Field of Search ............... 377/48, 56, 114, 47

[56] References Cited

U.S. PATENT DOCUMENTS

| 4,587,664 | 5/1986 | Iida | 377/48 |
| 4,658,406 | 4/1987 | Pappas | 377/48 |
| 4,991,187 | 2/1991 | Herold et al. | 377/48 |
| 5,063,579 | 11/1991 | Sasaki et al. | 377/48 |

FOREIGN PATENT DOCUMENTS

| 3116265 | 11/1982 | Fed. Rep. of Germany | 377/45 |
| 0165425 | 9/1983 | Japan | 377/48 |

Primary Examiner—John S. Heyman
Attorney, Agent, or Firm—Knobbe, Martens, Olson & Bear

[57] ABSTRACT

A frequency divider state machine synchronously divides an input clock's frequency by 1.5. The clock divider circuit includes two storage elements which are clocked on different edges of the input clock signal. The outputs of the two storage elements are combined together using combinatorial logic, the results of which are provided back to the inputs of the two storage elements. Further, the two outputs of the memory storage elements are combined together to provide the desired output frequency. Preferably, the circuit is designed such that if either of the two memory storage elements powers up in an undesired state, the divide by 1.5 circuit will automatically transition to one of the desired states and continue to provide the output frequency at the desired divide by 1.5 clock frequency after the initial transition. The circuit can be implemented as a digital circuit in an ASIC, an LSI, or the like.

9 Claims, 13 Drawing Sheets

| PRESENT STATE | | NEXT STATES | | | | OUTPUT |
|---|---|---|---|---|---|---|
| | | $C_A$ ⌐ | | $\overline{C_B}$ ⌐ | | |
| $Q_A$ | $Q_B$ | $Q_A'$ | $Q_B$ | $Q_A$ | $Q_B'$ | $F_{OUT}$ |
| 0 | 0 | X1 | 0 | 0 | X2 | X3 |
| 0 | 1 | 1 | 1 | 0 | 1 | 1 |
| 1 | 0 | 1 | 0 | 1 | 1 | 1 |
| 1 | 1 | 0 | 1 | 1 | 0 | 0 |

| PRESENT STATE | | NEXT STATES | | | | OUTPUT |
|---|---|---|---|---|---|---|
| | | $C_A \nearrow$ | | $\overline{C_B} \searrow$ | | |
| $Q_A$ | $Q_B$ | $Q_A{'}$ | $Q_B$ | $Q_A$ | $Q_B{'}$ | $F_{OUT}$ |
| 0 | 0 | 1 | 0 | 0 | 0 | 1 |
| 0 | 1 | X1 | 1 | 0 | X2 | X3 |
| 1 | 0 | 0 | 0 | 1 | 1 | 0 |
| 1 | 1 | 1 | 1 | 1 | 0 | 1 |

| PRESENT STATE | | NEXT STATES | | | | OUTPUT |
|---|---|---|---|---|---|---|
| | | $C_A$ ⌐ | | $\overline{C_B}$ ⌐ | | |
| $Q_A$ | $Q_B$ | $Q_A'$ | $Q_B$ | $Q_A$ | $Q_B'$ | $F_{OUT}$ |
| 0 | 0 | 0 | 0 | 0 | 1 | 1 |
| 0 | 1 | 1 | 1 | 0 | 0 | 0 |
| 1 | 0 | X1 | 0 | 1 | X2 | X3 |
| 1 | 1 | 0 | 1 | 1 | 1 | 1 |

| PRESENT STATE | | NEXT STATES | | | | OUTPUT |
|---|---|---|---|---|---|---|
| | | $C_A \nearrow$ | | $\overline{C_B} \searrow$ | | |
| $Q_A$ | $Q_B$ | $Q_A'$ | $Q_B$ | $Q_A$ | $Q_B'$ | $F_{OUT}$ |
| 0 | 0 | 1 | 0 | 0 | 1 | 0 |
| 0 | 1 | 0 | 1 | 0 | 0 | 1 |
| 1 | 0 | 0 | 0 | 1 | 0 | 1 |
| 1 | 1 | X1 | 1 | 1 | X2 | X3 |

CASE 1

FIG. 6A

| PRESENT STATE | | NEXT STATES | | | | OUTPUT |
|---|---|---|---|---|---|---|
| | | $C_A$ ⌐ | | $\overline{C_B}$ ¬ | | |
| $Q_A$ | $Q_B$ | $Q_A'$ | $Q_B$ | $Q_A$ | $Q_B'$ | $F_{OUT}$ |
| 0 | 0 | 0 | 0 | 0 | 0 | 0 |
| 0 | 1 | 1 | 1 | 0 | 1 | 1 |
| 1 | 0 | 1 | 0 | 1 | 1 | 1 |
| 1 | 1 | 0 | 1 | 1 | 0 | 0 |

CASE 2

FIG. 6B

| PRESENT STATE | | NEXT STATES | | | | OUTPUT |
|---|---|---|---|---|---|---|
| | | $C_A$ ⌐ | | $\overline{C_B}$ ¬ | | |
| $Q_A$ | $Q_B$ | $Q_A'$ | $Q_B$ | $Q_A$ | $Q_B'$ | $F_{OUT}$ |
| 0 | 0 | 0 | 0 | 0 | 0 | 1 |
| 0 | 1 | 1 | 1 | 0 | 1 | 1 |
| 1 | 0 | 1 | 0 | 1 | 1 | 1 |
| 1 | 1 | 0 | 1 | 1 | 0 | 0 |

CASE 3

FIG. 6C

| PRESENT STATE | | NEXT STATES | | | | OUTPUT |
|---|---|---|---|---|---|---|
| | | $C_A$ ⌐ | | $\overline{C_B}$ ¬ | | |
| $Q_A$ | $Q_B$ | $Q_A'$ | $Q_B$ | $Q_A$ | $Q_B'$ | $F_{OUT}$ |
| 0 | 0 | 0 | 0 | 0 | 1 | 0 |
| 0 | 1 | 1 | 1 | 0 | 1 | 1 |
| 1 | 0 | 1 | 0 | 1 | 1 | 1 |
| 1 | 1 | 0 | 1 | 1 | 0 | 0 |

CASE 4

FIG. 6D

| PRESENT STATE | | NEXT STATES | | | | OUTPUT |
|---|---|---|---|---|---|---|
| | | $C_A$ ⌐ | | $\overline{C_B}$ ⌐ | | |
| $Q_A$ | $Q_B$ | $Q_A'$ | $Q_B$ | $Q_A$ | $Q_B'$ | $F_{OUT}$ |
| 0 | 0 | 0 | 0 | 0 | 1 | 1 |
| 0 | 1 | 1 | 1 | 0 | 1 | 1 |
| 1 | 0 | 1 | 0 | 1 | 1 | 1 |
| 1 | 1 | 0 | 1 | 1 | 0 | 0 |

CASE 5

FIG. 6E

| PRESENT STATE | | NEXT STATES | | | | OUTPUT |
|---|---|---|---|---|---|---|
| | | $C_A$ ⌐ | | $\overline{C_B}$ ⌐ | | |
| $Q_A$ | $Q_B$ | $Q_A'$ | $Q_B$ | $Q_A$ | $Q_B'$ | $F_{OUT}$ |
| 0 | 0 | 1 | 0 | 0 | 0 | 0 |
| 0 | 1 | 1 | 1 | 0 | 1 | 1 |
| 1 | 0 | 1 | 0 | 1 | 1 | 1 |
| 1 | 1 | 0 | 1 | 1 | 0 | 0 |

CASE 6

FIG. 6F

| PRESENT STATE | | NEXT STATES | | | | OUTPUT |
|---|---|---|---|---|---|---|
| | | $C_A$ ⌐ | | $\overline{C_B}$ ⌐ | | |
| $Q_A$ | $Q_B$ | $Q_A'$ | $Q_B$ | $Q_A$ | $Q_B'$ | $F_{OUT}$ |
| 0 | 0 | 1 | 0 | 0 | 0 | 1 |
| 0 | 1 | 1 | 1 | 0 | 1 | 1 |
| 1 | 0 | 1 | 0 | 1 | 1 | 1 |
| 1 | 1 | 0 | 1 | 1 | 0 | 0 |

FIG. 6G

CASE 7

| PRESENT STATE | | NEXT STATES | | | | OUTPUT |
|---|---|---|---|---|---|---|
| | | $C_A$ ⌐ | | $\overline{C_B}$ ¬ | | |
| $Q_A$ | $Q_B$ | $Q_A'$ | $Q_B$ | $Q_A$ | $Q_B'$ | $F_{OUT}$ |
| 0 | 0 | 1 | 0 | 0 | 1 | 0 |
| 0 | 1 | 1 | 1 | 0 | 1 | 1 |
| 1 | 0 | 1 | 0 | 1 | 1 | 1 |
| 1 | 1 | 0 | 1 | 1 | 0 | 0 |

FIG. 6H

CASE 8

| PRESENT STATE | | NEXT STATES | | | | OUTPUT |
|---|---|---|---|---|---|---|
| | | $C_A$ ⌐ | | $\overline{C_B}$ ¬ | | |
| $Q_A$ | $Q_B$ | $Q_A'$ | $Q_B$ | $Q_A$ | $Q_B'$ | $F_{OUT}$ |
| 0 | 0 | 1 | 0 | 0 | 1 | 1 |
| 0 | 1 | 1 | 1 | 0 | 1 | 1 |
| 1 | 0 | 1 | 0 | 1 | 1 | 1 |
| 1 | 1 | 0 | 1 | 1 | 0 | 0 |

FIG. 7

| | 1st SET OF LOGIC GATES | 2nd SET OF LOGIC GATES | 3rd SET OF LOGIC GATES |
|---|---|---|---|
| CASE# | $D_A$ | $D_B$ | $F_{OUT}$ |
| 1 | $Q_A \oplus Q_B$ | $Q_A \oplus Q_B$ | $Q_A \oplus Q_B$ |
| 2 | $Q_A \oplus Q_B$ | $Q_A \oplus Q_B$ | $-(Q_A \cdot Q_B)$ |
| 3 | $Q_A \oplus Q_B$ | $-(Q_A \cdot Q_B)$ | $Q_A \oplus Q_B$ |
| 4 | $Q_A \oplus Q_B$ | $-(Q_A \cdot Q_B)$ | $-(Q_A \cdot Q_B)$ |
| 5 | $-(Q_A \cdot Q_B)$ | $Q_A \oplus Q_B$ | $Q_A \oplus Q_B$ |
| 6 | $-(Q_A \cdot Q_B)$ | $Q_A \oplus Q_B$ | $-(Q_A \cdot Q_B)$ |
| 7 | $-(Q_A \cdot Q_B)$ | $-(Q_A \cdot Q_B)$ | $Q_A \oplus Q_B$ |
| 8 | $-(Q_A \cdot Q_B)$ | $-(Q_A \cdot Q_B)$ | $-(Q_A \cdot Q_B)$ |

FREQUENCY DIVIDER CIRCUIT

BACKGROUND OF THE INVENTION

1. Field of the Invention

The present invention relates to the field of frequency dividers for digital electronic circuits.

2. Description of the Related Art

In many of today's complex computer systems, logic circuits often require their own unique clock frequencies. In order to provide these individual clocking frequencies to the logic circuits, separate crystal oscillators tuned to specific frequencies must be included on the circuit boards. Crystal oscillators require special isolation, including the proximate placement of a substantial number of capacitors to ensure that the waveform of the clock signal is clean. In order to accommodate all of the required crystal oscillators, a large percentage of the computer circuit board would have to be set aside for clock generation. In some cases, where the unique clock frequencies are binarily proportional to the input clock frequency, the unique clock frequencies can be derived from simple binary dividers which are attached to the input clock signals. In many cases, the binary relationships between the input clock frequency and the unique clock frequencies required by the individual circuits do not exist. Thus, in order to achieve these unique clock rates, a complex divider circuit is used to extract the unique frequencies from the input clock frequency. The amount of space on the circuit board required to implement a complex divider circuit may be considerably larger than the space required to isolate a unique crystal oscillator from the remainder of the system.

A few types of analog circuits can be used to divide the input clock signal by a fractional number to achieve a unique clock frequency. For example, a phase lock loop can be used to divide an input signal frequency by a fractional value such as 1.5. The analog phase lock loop is typically a very large circuit and is not easily integrated into large scale integrated circuits (LSI) or into application specific integrated circuits (ASIC) technologies which are presently used in a substantial number of new computer systems. This type of analog circuit generally is undesirable as it requires a large amount of real estate on a circuit board, and, furthermore, very few manufacturers can produce an ASIC with both digital and analog capabilities.

Another example of an attempt to provide a fractional divide-by frequency circuit utilizes a differentiator or a one-shot. In an exemplary divide-by 1.5 circuit, a one-shot is used to increase the frequency of the input signal by two. Next, the doubled frequency signal is applied to a modulo divide-by 3 counter which results in an output signal which is equivalent to the frequency of the input signal divided by 1.5. Systems which use a differentiator or a one-shot are very temperature sensitive. Further, some one-shots are unreliable beyond limited frequency ranges. Therefore, a need exists for a digitally implementable fractional divideby circuit that is frequency and temperature independent and that will enable the user to generate a desired clock frequency from a single input frequency. A further need exists for a simple digital clock divider circuit that can obtain clock speeds which are related to the available clock rates by a non-binarily related value, such as by a fractional value.

SUMMARY OF THE INVENTION

The present invention comprises a state machine which is used to divide an input clock frequency by 1.5. Thus, the present invention will provide an output signal having a frequency that is two thirds the frequency of the input clock signal.

One aspect of the present invention is a circuit that receives an input clock signal and generates an output clock signal with a frequency which is the frequency of the input clock signal divided by 1.5. The circuit comprises a first storage element having a first data input, a first clock input and a first data output. The first storage element stores the data on the first data input on occurrence of each rising edge of the input clock signal at the first clock input. The circuit also comprises a second storage element having a second data input, a second clock input, and a second data output. The second storage element stores the data on the second data input on occurrence of each falling edge of the input clock signal at the second clock input. The circuit further comprises combinatorial logic responsive to data on the first data output and data on the second data output to provide an output signal of the circuit. The output signal has a frequency which is the frequency of the input clock signal divided by 1.5. The combinatorial logic further provides a first input signal to the first data input of the first storage element and provides a second input signal to the second data input of the second storage element.

In one preferred embodiment of the present invention, output signal, the first input signal and the second input signal generated by the combinatorial logic are the same signal. The combinatorial logic comprises a single combinatorial logic gate to generate the output signal, the first input signal and the second input signal. In one particularly preferred embodiment of the circuit, the single combinatorial logic gate is a NAND-gate. In another particularly preferred embodiment of the circuit, the single combinatorial logic gate is a NOR-gate.

In an alternative preferred embodiment, the first input signal and the second input signal generated by the combinatorial logic are the same signal. The combinatorial logic comprises first and second combinatorial logic gates. The combinatorial logic gate generates the first input signal and the second input signal, and the second combinatorial logic gate generates the output signal.

In a further alternative preferred embodiment of the circuit, the first input signal and the output signal generated by the combinatorial logic are the same signal. The combinatorial logic comprises first and second combinatorial logic gates. The first combinatorial logic gate generates the first input signal and the output signal. The second combinatorial logic gate generates the second input signal.

In preferred embodiments of the circuit of the present invention, the first storage element and the second storage element comprise D-flip-flops.

Another aspect of the present invention is a state machine that comprises four states. One of the four states is an undesired state and three of the four states are desired states. Preferably, the state machine operates such that if the undesired state occurs, the state machine will transition to one of the preferred states. Furthermore, the undesired state will not occur during normal operation of the state machine. The state machine further operates such that the state machine spends one half-cycle out of every three half-cycles of the input clock in one of the three desired states. An input clock signal controls the transitions between the four states of the state machine so that the state machine generates an output clock signal which has a first logic level when the state machine is in one of the three desired states and which has a second logic level when the state machine is in either of the other two of the three desired states. This causes the output clock signal to have a frequency which is the frequency of the input clock signal divided by 1.5.

A further aspect of the present invention is a state machine that divides an input clock signal by 1.5 to generate an output clock signal having a frequency that is two thirds the frequency of the input clock signal. The state machine comprises an input that receives the input clock signal and an output that generates the output clock signal. The state machine has three active states responsive to the input clock signal. The output is responsive to a first one of the three active states to cause the output clock signal to have a first logic level and is responsive to the other two of the three active states to cause the output clock signal to have a second logic level. The state machine sequences through the three active states such that the first one of the active states occurs during every third half-cycle of the input clock signal.

BRIEF DESCRIPTION OF THE DRAWINGS

FIGS. 6A-6H illustrate the logic table of FIG. 2a expanded to include all of the possible implementations of the don't care conditions.

FIG. 7 illustrates a table of logic equations which can be used to implement the logic tables of FIGS. 6A-6H.

DETAILED DESCRIPTION OF THE PREFERRED EMBODIMENTS

Figure 1:
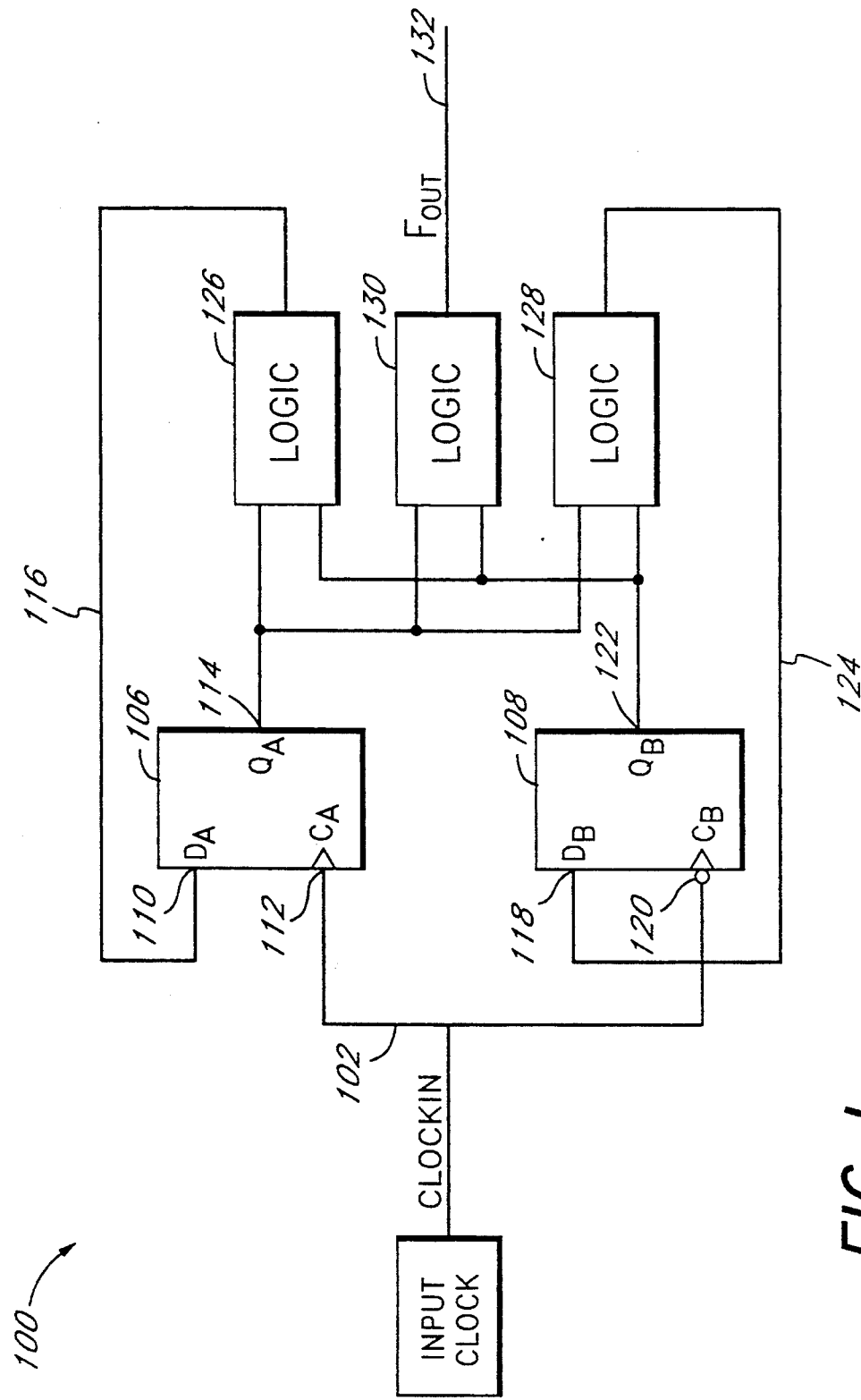
FIG. 1 is a block diagram of the divide by 1.5 circuit of the present invention.

FIG. 1 illustrates a block diagram of a circuit 100 in accordance with the present invention. As will be described below, the circuit 100 of FIG. 1 provides an output frequency which results from dividing the frequency of an input clock signal 102 by 1.5. Thus, the output frequency is two thirds the input frequency.

The circuit 100 of FIG. 1 comprises first and second storage elements 106, 108 each of which is clocked on different edges of an input clock signal 102. A first storage element 106 comprises a data input (DA) 110, a clock input (CA) 112, and a data output (QA) 114. A first data input line 116 at the DA input 110 is clocked into the first storage element 106 on a rising edge of the input clock signal 102, which is defined as the transition of the input clock signal 102 from a low logic level to a high logic level, at the clock input CA 112. This rising edge is also referred to as the leading edge of the clock signal. A second storage element 108 comprises a data input (DB) 118, a clock input (CB) 120, and a data output (QB) 122. A second data input line 124 at the DB input 118 is clocked into the second storage element 108 on a falling edge of an input clock signal 102, which is defined as the transition of the input clock signal 102 from a high logic level to a low logic level, at the clock input CB 120. This falling edge is also referred to as the trailing edge of the clock signal. After the respective edge of the input clock signal 102 has occurred, the respective data outputs of a storage element will be equal to the data input of that storage element.

The data outputs, QA 114 and QB 122, of the first and second storage elements 106, 108 are combined together using a first set of combinatorial logic gates 126 to provide the first data input line 116 to the first data input DA 110. The data outputs, QA 114 and QB 122, of the first and second storage elements 106, 108 are combined using a second set of combinatorial logic gates 128 to provide the second data input line 124 to the second data input DB 118. Further, the outputs, QA 114 and QB 122, of the first and second storage elements 106, 108 are combined using a third set of combinatorial logic gates 130 to provide the desired output frequency on the output signal line, FOUT 132.

The circuit of the present invention is used to implement a state machine which provides an output signal having a frequency that is the input frequency divided by 1.5. On occurrence of a rising clock edge and a falling clock edge, respectively, of the input clock signal 102, the storage elements 106, 108 will clock in data from the respective input lines to provide one of four possible data combinations, or states, on the data output lines 114, 122. The four possible states are 00, 01, 10 and 11. In order to divide the frequency of the input clock signal 102 by 1.5, the output signal FOUT 132 must be enabled for two out of every three occurrences of the input clock signals 102. In order to achieve this ratio of two outputs per three inputs, one of the four possible output combinations must be considered an undesired state, thus leaving three remaining preferred states of the data output lines 114, 122. The output signal FOUT 132 will be enabled for two out of the three remaining output states, thus dividing the input clock frequency by 1.5. The circuit 100 of the present invention can therefore be implemented in four different ways, by choosing a different one of the four output combinations 00, 01, 10 or 11, as being the undesired state.

It is also possible to construct the circuit of FIG. 1 using reset circuitry (not shown) such that the circuitry is prevented from starting in the undesired state, either by presetting the memory storage elements 106, 108 on power up or resetting the memory storage elements 106, 108 on detection of the undesired state.

FIGS. 2A-B, 3A-B, 4A-B, and 5A-B illustrate logic tables and timing diagrams for the four different undesired states of the data outputs QA 114 and QB 122. The logic tables illustrate the data outputs, QA 114 and QB 122, the next output states of QA 114 and QB 122 and the resultant output FOUT 132 for each desired state of the state machines. The next states are broken down into two types of states, the state QA'QB which occurs after clock CA 112 has occurred and the state QAQB' which occurs after clock CB 120 has occurred. As the first and second memory storage elements 106, 108 are clocked on two different edges of the input clock signal 102, the next states of the outputs QA 114 and QB 122 will vary with each edge of the input clock signal 102. Thus, after the rising edge clock CA 112 has occurred at the first memory storage element 106, the output will advance to the next state of QA 114 which is represented above as QA', but the state of QB 122 will remain unchanged. After falling edge clock CB 120 has occurred at the second memory storage element 108, the output will advance to the next state of QB 122 which is represented above as QB', but the state of QA 114 will remain unchanged. Therefore the next state of the outputs of the first and second memory storage elements 106, 108 will be determined by the edge of the input clock 102 that is received. Further, the undesired state will be represented as a DON'T CARE condition and will be replaced with Xs in the logic tables of FIGS. 2A, 3A, 4A and 5A. The timing diagrams illustrate the timing of the input clock signal 102, the data outputs, QA 114 and QB 122, and the output signal FOUT 132 which corresponds to the input clock signal 102 divided by 1.5 for each of the four possible undesired states.

Figures 2A, 2B:
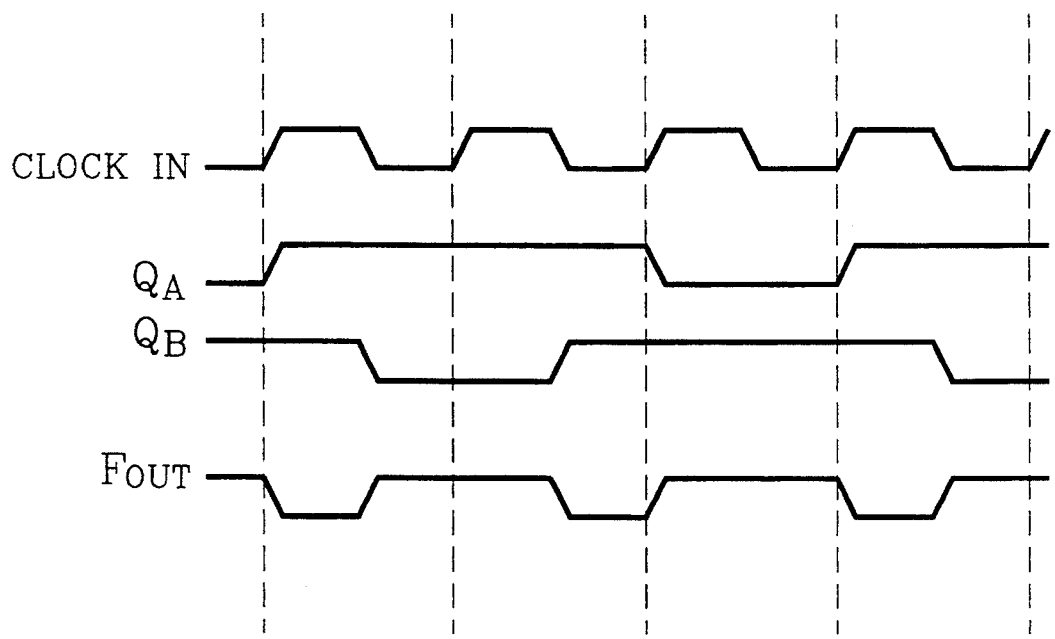
FIG. 2A illustrates a logic table of the state machine used to implement the circuit of FIG. 1 with 00 chosen as the undesired state.
FIG. 2B illustrates a timing diagram of the logic table of FIG. 2A.
Figures 3A, 3B:
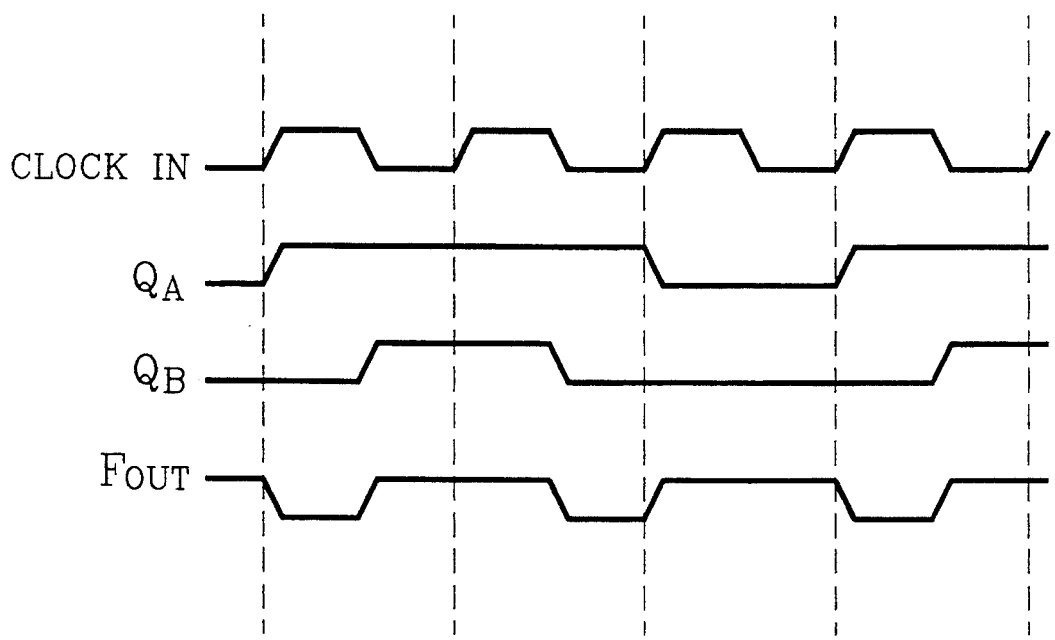
FIG. 3A illustrates a logic table of the state machine used to implement the circuit of FIG. 1 with 01 chosen as the undesired state.
FIG. 3B illustrates a timing diagram of the logic table of FIG. 3A.
Figures 4A, 4B:
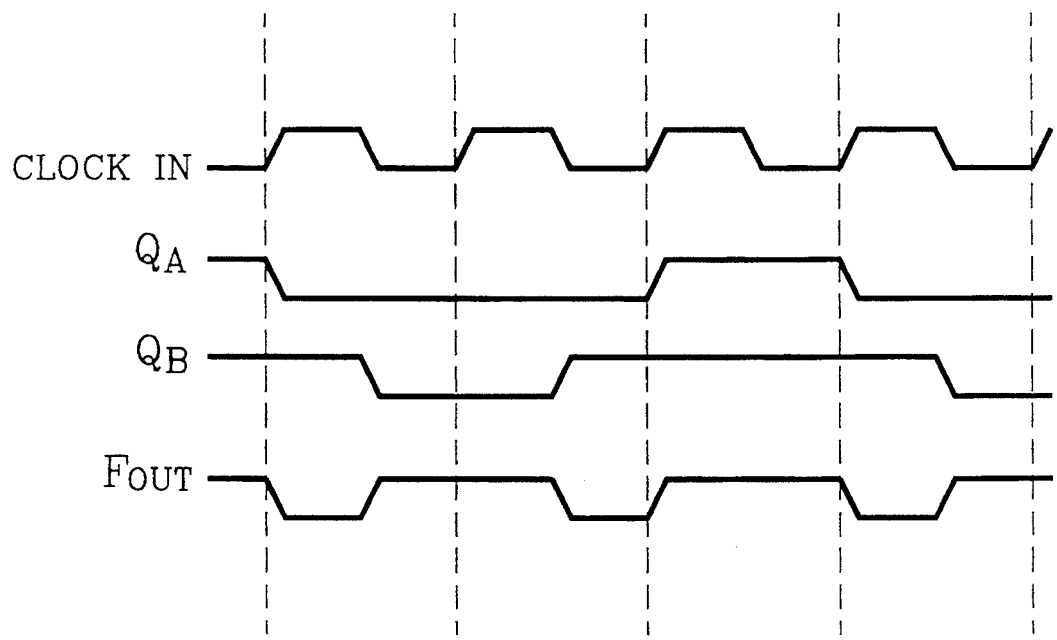
FIG. 4A illustrates a logic table of the state machine used to implement the circuit of FIG. 1 with 10 chosen as the undesired state.
FIG. 4B illustrates a timing diagram of the logic table of FIG. 4A.
Figures 5A, 5B:
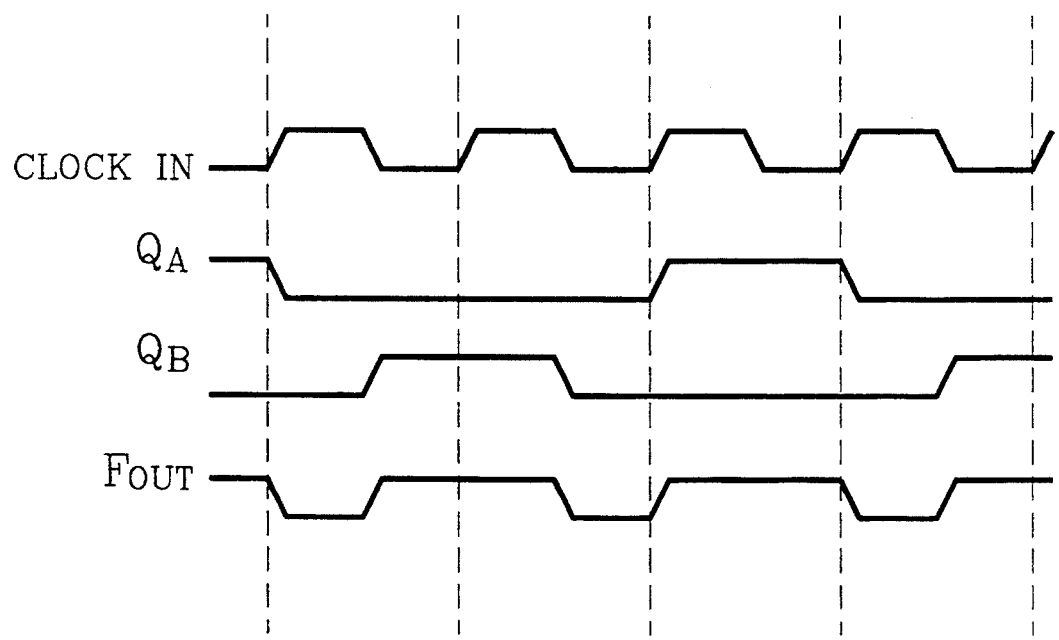
FIG. 5A illustrates a logic table of the state machine used to implement the circuit of FIG. 1 with 11 chosen as the undesired state.
FIG. 5B illustrates a timing diagram of the logic table of FIG. 5A.

FIG. 2A illustrates a logic table with 00 chosen as the undesired state. FIG. 2B illustrates a timing diagram of the logic table of FIG. 2A. FIG. 3A illustrates a logic table with 01 chosen as the undesired state. FIG. 3B illustrates a timing diagram of the logic table of FIG. 3A. FIG. 4A illustrates a logic table with 10 chosen as the undesired state. FIG. 4B illustrates a timing diagram of the logic table of FIG. 4A. FIG. 5A illustrates a logic table with 11 chosen as the undesired state. FIG. 5B illustrates a timing diagram of the logic table of FIG. 5A.

It can be seen from the timing diagrams of FIGS. 2B, 3B, 4B and 5B that the state machine of the present invention spends one third of its time in a first one of the desired states and two thirds of its time in the other two of the desired states. For example, referring to FIG. 2B, the state machine cycles through the states as follows: 11, 10, 10, 11, 01, 01, 11, 10, 10, 11, 01, 01 . . . Thus, the state machine spends one half-cycle out of every three halfcycles of the input clock signal in state 11 (QA=1, QB=1) and the next two clock cycles in either state 10 (QA=1, QB=0) or state 01 (QA=0, QB=1). The FOUT signal is generated by making one logic level (e.g., the low or zero logic level) of the FOUT signal active when the state machine is in the first one of the desired states and making the other logic level (e.g., the high or one logic level) active when the state machine is in either of the other two desired states. In each of the FIGS. 2B, 3B, 4B and 5B, the resulting FOUT signal is illustrated as in the logic low level for one third of each cycle and in the logic high level for two thirds of each cycle. Thus, FOUT has a duty cycle of one out of three in the low logic level at a frequency equal to the frequency of the input clock signal divided by 1.5. One skilled in the art will realize that the FOUT signal may also be generated as a signal which is in the logic low level for two thirds of each cycle and in the logic high level for one third of each cycle.

Each X in the logic tables 2A, 3A, 4A and 5A represents a DON'T CARE condition which means the state machine does not care if the X is at a logic high level or at a low level, i.e., a zero or a one. Thus each of the four logic tables in FIGS. 2A, 3A, 4A and 5A must be expanded to include each of the two possibilities, a logic high level or low level, for the DON'T CARE conditions $X_1$, $X_2$, and $X_3$. This expansion creates eight possible combinations to each logic table. Therefore, the circuit of the present invention can be embodied in four possible ways each with eight different DON'T CARE alternatives resulting in at least thirty-two different ways of implementing the divide by 1.5 circuit of the present invention. As discussed below, not all of the thirty-two possible combinations are preferred combinations.

As the substitution of all of the possible combinations of the DON'T CARE variables $X_1$, $X_2$, and $X_3$ into the logic tables of FIGS. 3A, 4A and 5A, will be similar for each case of the undesired input values, an exemplary case of 00 as the undesired case will be chosen, for expansion, and will be described in detail below. The other three cases can be expanded using the method described in the exemplary 00 case.

Figure 8A:
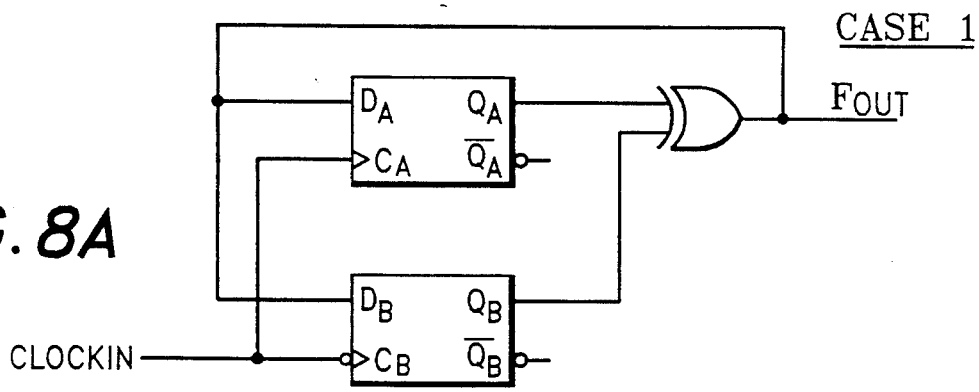
FIGS. 8A-8B illustrate the circuit of FIG. 1 with the logic equations of Cases 1 and 2 of FIG. 7 substituted for the first, second and third blocks of logic gates, wherein both circuits of FIGS. 8A-8B contain a lock up problem which may cause the circuit to remain in the undesired state if the circuit ever powers up in the undesired state.
Figure 8B:
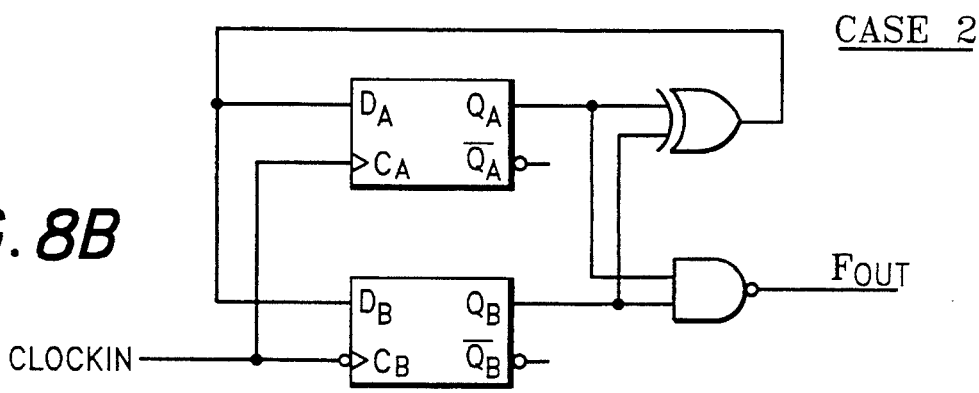

FIGS. 6A-6H illustrate logic tables for each possible DON'T CARE conditions which have 00 chosen as the undesired state. Therefore FIGS. 6A-6H illustrate the logic table of FIG. 2A expanded to include all of the possible combinations of the DON'T CARE variables $X_1$, $X_2$, and $X_3$ for each condition. Applying standard state table reduction techniques to the state tables of FIGS. 6A-6H, the possible set of first 126, second 128 and third 130 combinatorial logic equations are determined and illustrated in FIG. 7. FIG. 7 therefore illustrates the required sets of logic equations to achieve the desired data inputs, DA 110 and DB 118, and the desired output signal, FOUT 132, respectively. FIG. 8A-8B illustrates the first 126, second 128 and third 130 sets of combinatorial logic gates of the circuit 100 of FIG. 1 that implement the set of logic equations in FIG. 7, for the first two cases of the DON'T CARE conditions. FIGS. 9A-9F illustrate the circuit of FIG. 1 with the logic equations for cases 3–8 of FIG. 7 implemented for the first, second and third blocks of logic gates.

As illustrated in FIG. 1, the circuit 100 relies on the combination of the outputs QA 114 and QB 122 of the first and second memory storage elements 106, 108 to generate the input signals DA 110 and DB 118. As there are no other input variables used, it is possible that the circuit of the present invention will power up into one of the input combinations which is designated as an undesired state. Some of the possible embodiments of the circuitry of the present invention will remain in the undesired state if such a state is entered. In particular, when 00 is chosen as the undesired state, as illustrated in FIGS. 8A–8B and 9A–9F, two of the embodiments of the circuitry will remain in the 00 state if they power up in this state. In particular, in FIGS. 8A–8B, the next states of state 00 are both 00 irrespective of which clock signal occurs. On the other hand, the preferred embodiments of the circuit of the present invention are selected such that if either of the two memory storage elements powers up in an undesired state, the divide by 1.5 circuit will automatically transition to one of the preferred states and continue to provide the output frequency at the desired divide by 1.5 clock frequency after the initial transition. The embodiments of the circuitry of the 00 undesired state which will transition to one of the preferred states are illustrated in FIGS. 9A–9F.

Figure 10:
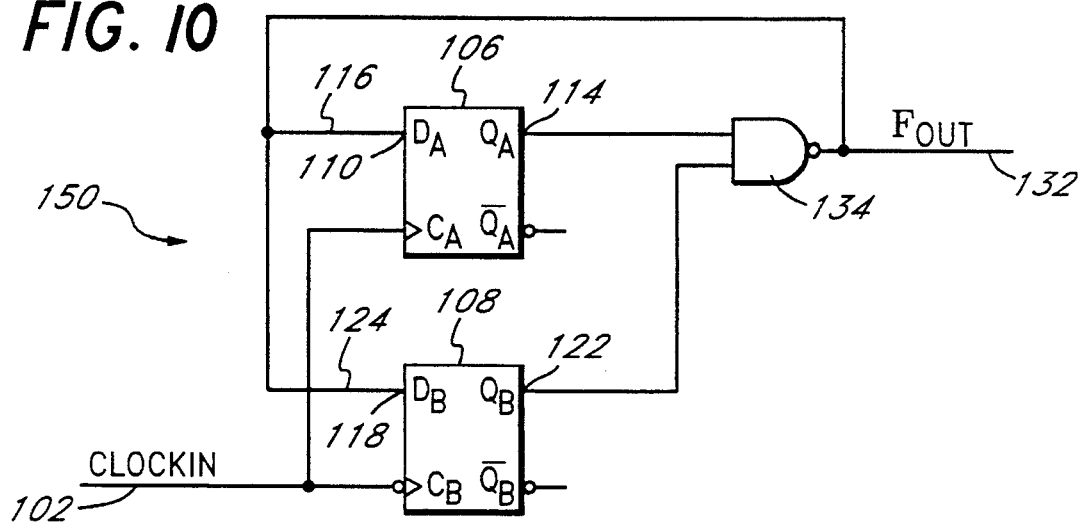
FIG. 10 illustrates a preferred embodiment of the circuit of FIG. 1 with 00 chosen as the undesired state.

More preferably, the circuit of FIG. 1 is designed such that the outputs QA 110 and QB 118 of the first and second storage elements 106, 108 are combined using a single set of combinatorial logic, rather than requiring three different sets of combinatorial logic, 126, 128 and 130, to generate signals which are applied to the inputs, DA 110 and DB 118, and to the output, FOUT 132. By utilizing only one set of combinatorial logic to determine DA 110, DB 118 and FOUT 132, the complexity of the logic required to implement the circuit of the present invention will be greatly reduced. FIG. 10 illustrates a circuit 150 which is a preferred embodiment of the circuit 100 of FIG. 1.

Figure 9A:
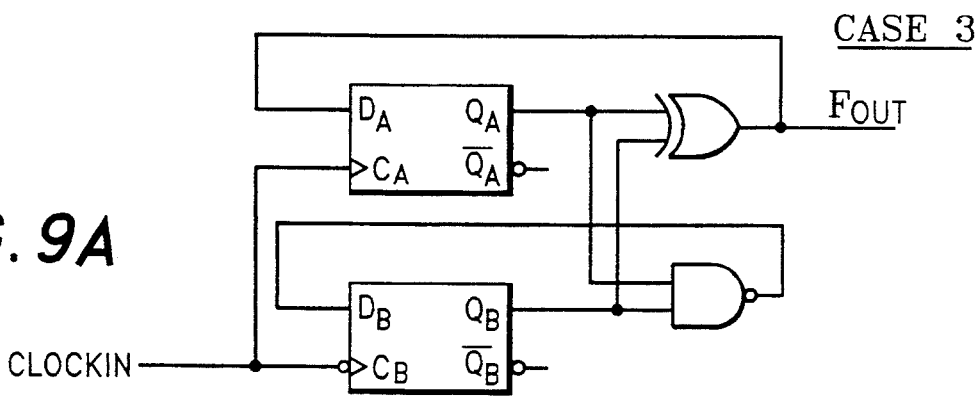
FIGS. 9A-9F illustrate the circuit of FIG. 1 with the logic equations of Cases 3-8 of FIG. 7 substituted for the first, second and third blocks of logic gates, wherein the circuits of FIGS. 9A-9F will transition into one of the preferred states, if the circuit ever powers up in the undesired state.
Figure 9B:
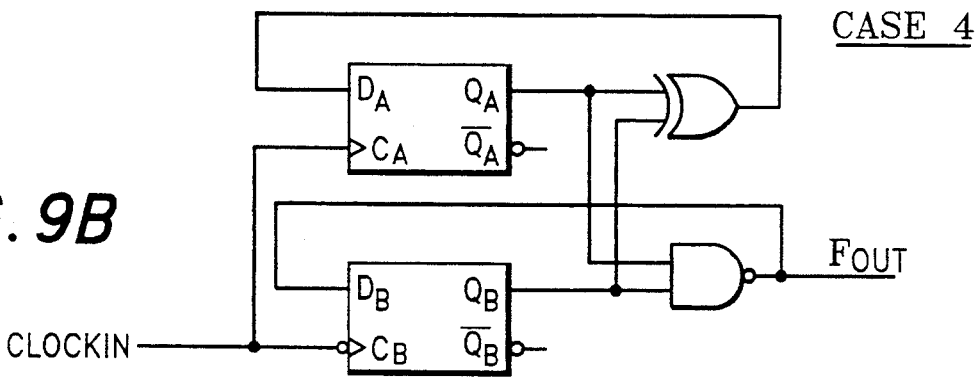
Figure 9C:
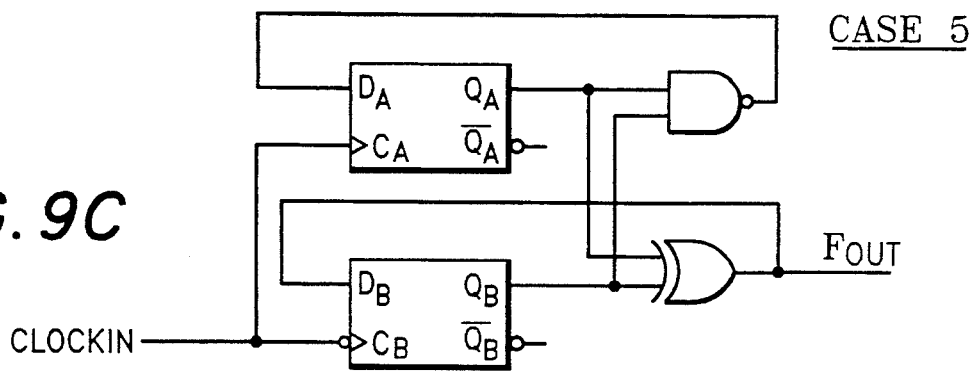
Figure 9D:
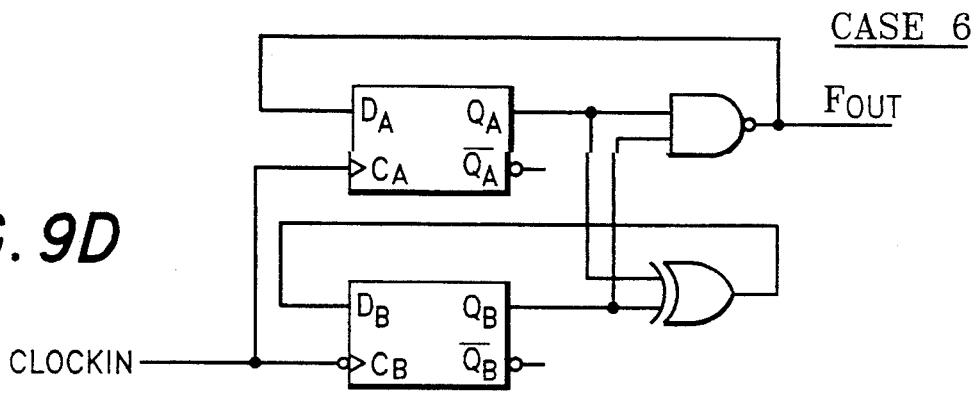
Figure 9E:
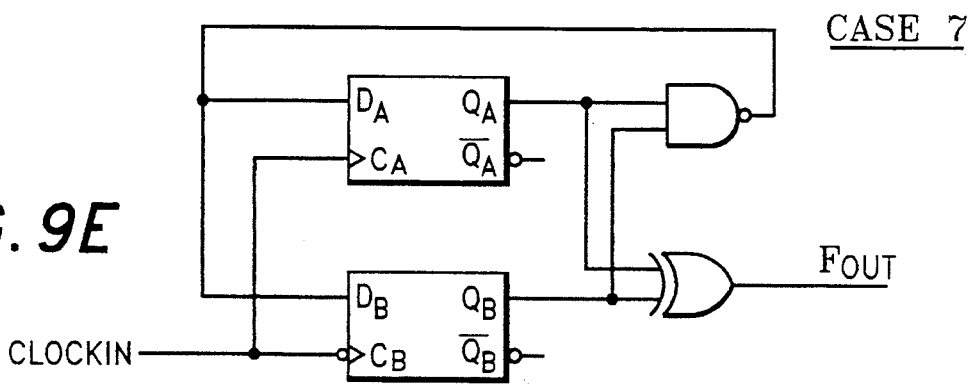
Figure 9F:
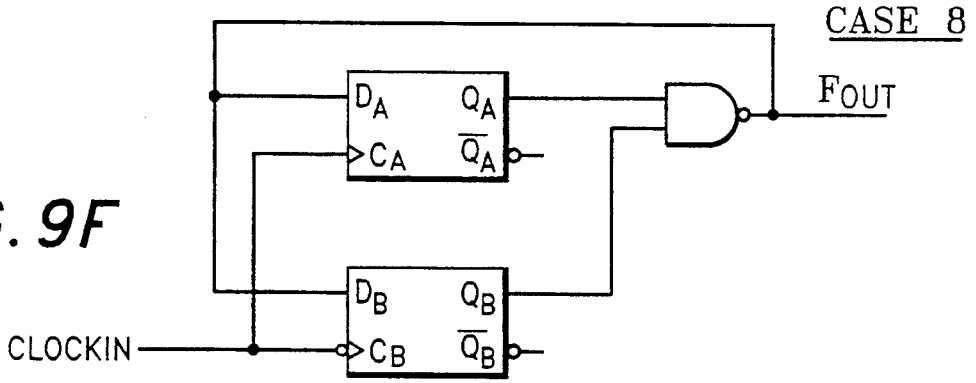

The circuit 150 is corresponds to the circuits illustrated in FIG. 9A which is a preferred embodiment because the identical set of logic equations are used to generate the signals to the inputs DA 110 and DB 118 and the signal to the FOUT output 132. In particular, a single NAND gate 134 provides the combinatorial logic connected to the signal line 116 to the DA input 110, connected to the signal line 124 to the DB input 118, and connected to the FOUT output 132.

Figure 11:
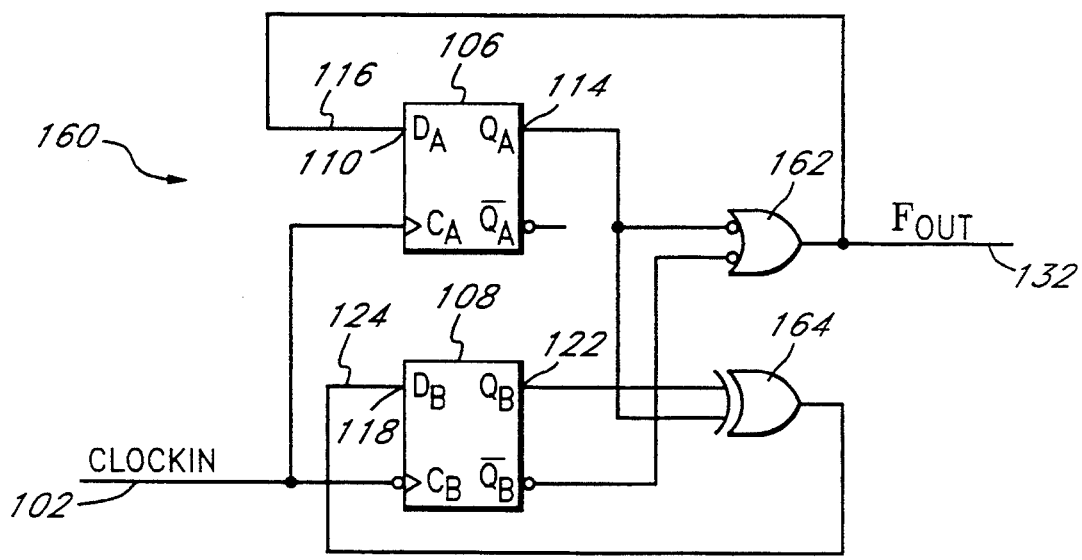
FIG. 11 illustrates a preferred embodiment of the circuit of FIG. 1 with 01 chosen as the undesired state.

FIG. 11 illustrates a circuit 160 which is a preferred embodiment of the circuit 100 of FIG. 1 when 01 is chosen as the undesired case. The circuit 160 was chosen over the other possible embodiments of the circuit of FIG. 1 when 01 is chosen as the undesired state because a single logic gate 162 (an inverted input OR gate) generates the signal to the DA input 110 and FOUT output 132. A second logic gate 164 (exclusive-OR) generates the signal to the DB input 118.

Figure 12:
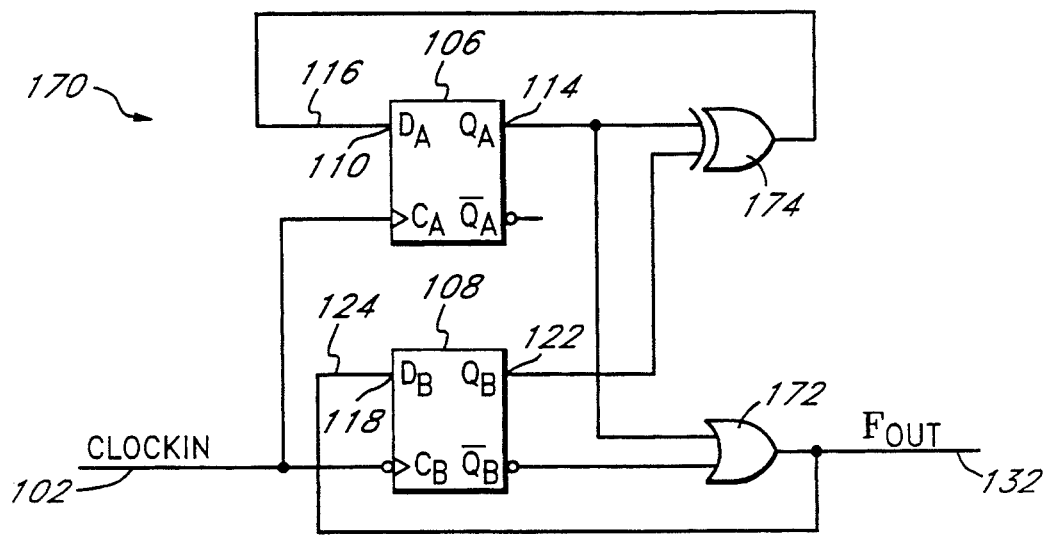
FIG. 12 illustrates a preferred embodiment of the circuit of FIG. 1 with 10 chosen as the undesired state.

FIG. 12 illustrates a circuit 170 which is a preferred embodiment of the circuit 100 of FIG. 1 when 10 is chosen as the undesired case. The circuit 170 was chosen over the other possible embodiments of the circuit of FIG. 1 when 10 is chosen as the undesired state because a single logic gate 172 (OR) is used to generate the signals to the DB input 118 and the FOUT output 132. A second logic gate 174 (exclusive-OR) generates the signal to the DA input 110.

Figure 13:
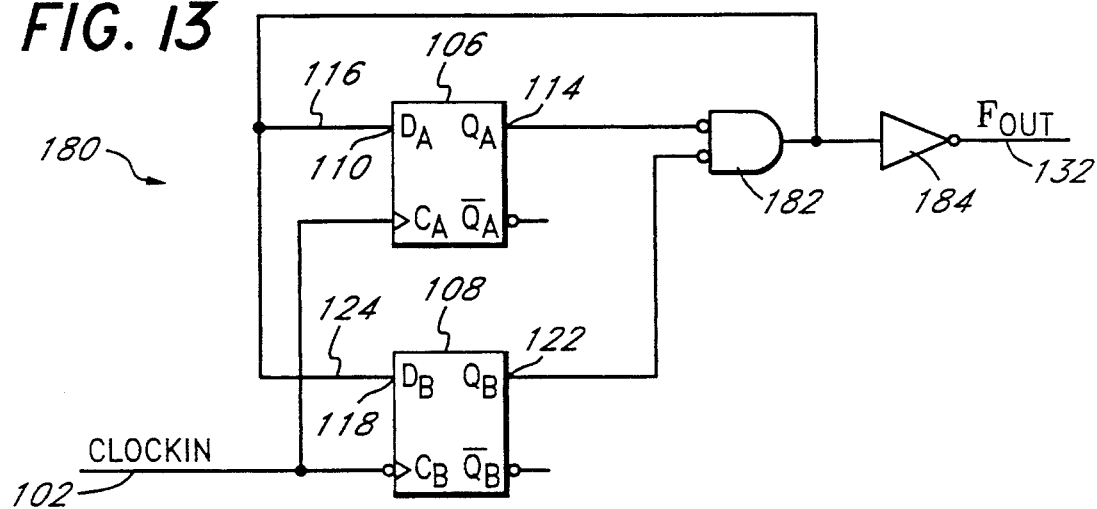
FIG. 13 illustrates a preferred embodiment of the circuit of FIG. 1 with 11 chosen as the undesired state.

FIG. 13 illustrates a circuit 180 which is a preferred embodiment of the circuit 100 of FIG. 1 when 11 is chosen as the undesired case. The circuit 180 was chosen over the other possible embodiments of the circuit of FIG. 1 when 11 is chosen as the undesired state because a single logic gate 182 (inverted input AND) is used to generate the signals to the DA input 110 and the DB input 118. The output signal FOUT 132 is generated by simply inverting the signal used to generate the DA input 110 and the DB input 118. A simple inverter 184 is used for this purpose.

Figure 14:
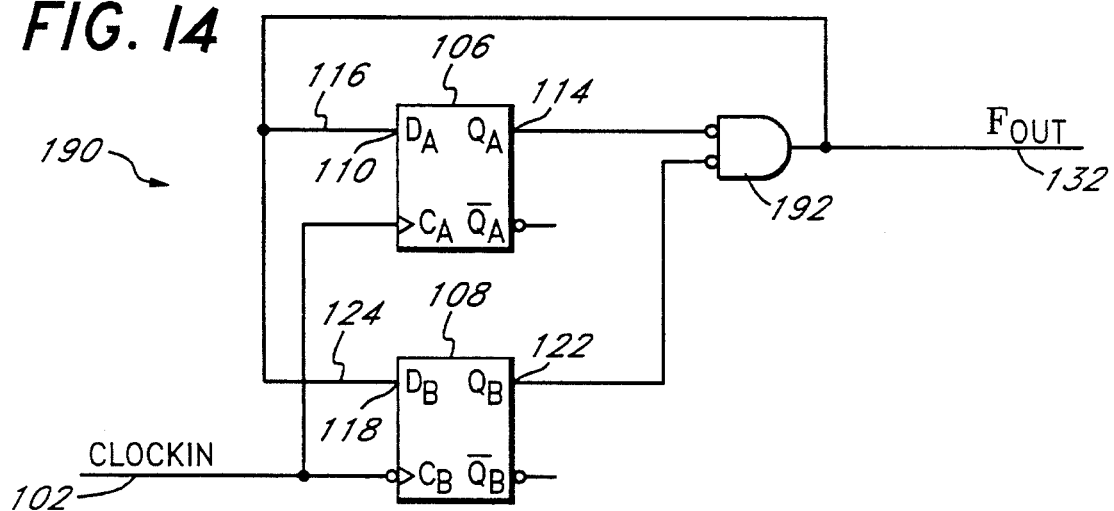
FIG. 14 illustrates a preferred embodiment of the circuit of FIG. 1 with 11 chosen as the undesired state and with FOUT as a signal which is high for one third of a cycle and low for two thirds of the cycle.

FIG. 14 illustrates a circuit 190 which is a preferred embodiment of the circuit 100 of FIG. 1 when 11 is chosen as the undesired case and with FOUT as a signal which is high for one third of a cycle and low for two thirds of the cycle. The circuit of FIG. 14 is equivalent to the circuit of FIG. 13 with the inverter 184 removed. The circuit 190 was chosen over the other possible embodiments of the circuit of FIG. 1 when 11 is chosen as the undesired state because a single logic gate 192 (an inverted input AND gate) is used to generate the signals to the DA input 110 and the DB input 118 and to generate the FOUT signal.

Figure 15:
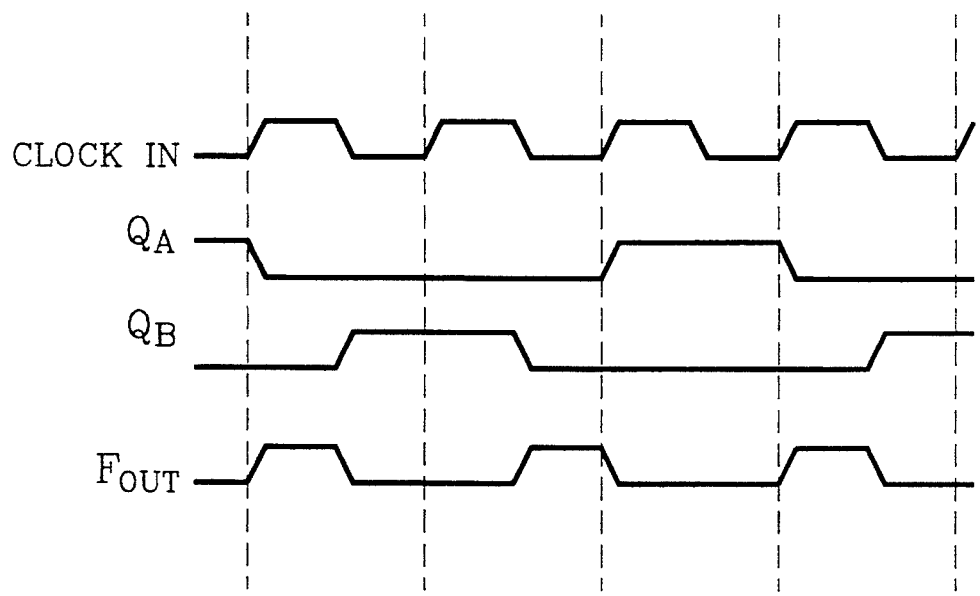
FIG. 15 illustrates a timing diagram of the circuit of FIG. 14 with 11 chosen as the undesired state and with FOUT as a signal which is high for one third of a cycle and low for two thirds of the cycle.

FIG. 15 illustrates a timing diagram of the circuit of FIG. 14 with 11 chosen as the undesired state. FIG. 15 is similar to the timing diagram of FIG. 5B but the FOUT signal is illustrated as a signal which is high for one third of a cycle and low for two thirds of the cycle. Thus, in this case the FOUT signal has a duty cycle of one out of three in the low logic level at a frequency equal to the frequency of the input clock signal divided by 1.5. The choice of which logic level is active for one third of the cycle and which logic level is active for two thirds of the cycle can be made by choosing the logic gate that generates FOUT or by using an inverter as shown in FIG. 13.

The circuits 150 of FIG. 10 and 190 of FIG. 14 only require a single logic gate, a NAND gate 134 or an inverted input AND gate 192, to generate inputs DA 110, DB 118 and the output FOUT 132 and are therefore more preferred embodiments of the circuit 100 of FIG. 1. One advantage of the reduction of the required combinatorial logic in the circuits 150 and 190 to a single gate is that the circuit will require significantly less real estate on the circuit board than the other embodiments. Another advantage of the circuits 150 and 190 is that such a small digital circuit, i.e., one gate and two storage elements, can be easily integrated into a large scale integrated circuit (LSI) made of GaAs or an N-channel CMOS gate array which are both presently used in a substantial number of new computer systems. Further, the NAND gate 134 used to implement the combinatorial logic of the circuit 150 requires the least amount of space to implement in a CMOS array, and therefore would be preferable over other types of logic gates if a CMOS array is used to implement the circuit of the present invention. The inverted input AND gate 192 in the circuit 190 can be replaced with an equivalent gate such as a NOR gate if a GaAs array is used. A NOR gate requires the least amount of space to implement in a GaAs array, and therefore would be preferable over other types of logic gates, if a GaAs array is used to implement the circuit of the present invention. Therefore, the logic gates used to implement the circuit of the present invention can be altered to an equivalent form, i.e., replace an inverted input AND gate with a NOR gate, to optimize implementation in gate arrays or other logic circuits comprised of different materials.

The circuit of the present invention is a purely digital circuit which provides a glitch-free divide by 1.5 output signal regardless of the frequency of the input signal. In addition, the digital circuit will provide a clean error free signal over a wide range of temperatures. The edge jitter of the clock cannot be completely removed, but the output signal of the present invention can be used to clock most conventional integrated circuit (IC) chips. If an input signal has a 60/40 duty cycle, the output signal will only have a 13.33% edge jitter which is a suitable for most conventional clocking IC applications.

The circuit of the present invention may be embodied in other specific forms without departing from its spirit or essential characteristics. It should be further understood that although the present invention has been described with respect to changes initiated by transitions in the input signals from logic high levels to logic low levels, the opposite transition can also be used. The described embodiments are to be considered in all respects only as illustrative and not restrictive, i.e., the memory storage elements could be implementable as toggle flip-flops, J-K flip-flops, R-S flip-flops, etc. The scope of the invention is, therefore, indicated by the appended claims rather than the foregoing description. All changes which come within the meaning and range of equivalency of the claims are to be embraced within their scope.

What is claimed is:

1. A logic circuit incorporated in a large scale integrated circuit that receives an input clock signal and generates an output clock signal with a frequency which is the frequency of the input clock signal divided by 1.5, comprising:
    a first storage element, said first storage element having a first data input, a first clock input and a first data output, said first storage element storing said first data input on occurrence of each rising edge of said input clock signal at said first clock input;
    a second storage element, said second storage element having a second data input, a second clock input, and a second data output, said second storage element storing said second data input on occurrence of each falling edge of said input clock signal at said second clock input; and
    combinatorial logic responsive to said first data output and said second data output to provide an output signal of said circuit, said output signal having a frequency which is the frequency of said input clock signal divided by 1.5, said combinational logic further providing a first input signal to said first data input of said first storage element and providing a second input signal to said second data input of said second storage element.

2. The circuit defined in claim 1, wherein said output signal, said first input signal and said second input signal generated by said combinatorial logic are the same signal.

3. The circuit as defined in claim 2, wherein said combinatorial logic comprises a single combinatorial logic gate to generate said output signal, said first input signal and said second input signal.

4. The circuit as defined in claim 3, wherein said single combinatorial logic gate is a NAND-gate.

5. The circuit as defined in claim 1, wherein said first input signal and said second input signal generated by said combinatorial logic are the same signal.

6. The circuit as defined in claim 5, wherein said combinatorial logic comprises first and second combinatorial logic gates, and wherein said combinatorial logic gate generates said first input signal and said second input signal and said second combinatorial logic gate generates said output signal.

7. The circuit as defined in claim 1, wherein said first input signal and said output signal generated by said combinatorial logic are the same signal.

8. The circuit as defined in claim 7, wherein said combinatorial logic comprises first and second combinatorial logic gates, and wherein said first combinatorial logic gate generates said first input signal and said output signal and said second combinatorial logic gate generates said second input signal.

9. The circuit as defined in claim 1, wherein said first storage element and said second storage element comprise D-flip-flops.

* * * * *

UNITED STATES PATENT AND TRADEMARK OFFICE
CERTIFICATE OF CORRECTION

PATENT NO. : 5,339,345
DATED : August 16, 1994
INVENTOR(S) : Lewis R. Mote, Jr.

It is certified that error appears in the above-indentified patent and that said Letters Patent is hereby corrected as shown below:

In Claim 1, column 10, at line 7, change "said combinational" to --said combinatorial--

Signed and Sealed this

Twenty-sixth Day of August, 1997

Attest:

BRUCE LEHMAN

Attesting Officer

Commissioner of Patents and Trademarks